United States Patent
Park et al.

(10) Patent No.: US 8,248,098 B2
(45) Date of Patent: Aug. 21, 2012

(54) APPARATUS AND METHOD FOR MEASURING CHARACTERISTICS OF SEMICONDUCTOR DEVICE

(75) Inventors: Chan-Ho Park, Goyang-si (KR); Won-Young Jung, Nowen-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 397 days.

(21) Appl. No.: 12/647,499

(22) Filed: Dec. 27, 2009

(65) Prior Publication Data
US 2010/0164532 A1    Jul. 1, 2010

(30) Foreign Application Priority Data
Dec. 30, 2008 (KR) .................. 10-2008-0137541

(51) Int. Cl.
*G01R 31/02* (2006.01)

(52) U.S. Cl. ......... 324/762.09; 324/762.01; 324/762.02; 257/48; 331/57; 327/156

(58) Field of Classification Search .......... 324/762.01–762.02, 762.09; 257/48; 331/57; 327/156
See application file for complete search history.

(56) References Cited

U.S. PATENT DOCUMENTS

| | | | |
|---|---|---|---|
| 5,594,392 A * | 1/1997 | Kondoh et al. | 331/57 |
| 5,990,671 A * | 11/1999 | Nagata | 323/313 |
| 7,793,119 B2 * | 9/2010 | Gammie et al. | 713/300 |
| 2005/0012556 A1 * | 1/2005 | Bhushan et al. | 331/57 |

* cited by examiner

*Primary Examiner* — Arleen M Vazquez
(74) *Attorney, Agent, or Firm* — Sherr & Vaughn, PLLC

(57) ABSTRACT

An apparatus and method for measuring the characteristics of a semiconductor device is disclosed. The measuring apparatus may include first to M-th (wherein M is a positive integer not less than 1) starved devices each being biased in response to a bias voltage varying in accordance with a variable first supply voltage, thereby varying an amount of current flowing through a semiconductor device included in the starved device. Interconnect lines may interconnect the first to M-th starved devices. A measuring unit measures at least one of a delay time caused by the semiconductor devices of the starved devices themselves, and a compound delay time caused by the semiconductor devices of the starved devices themselves plus a delay time caused by the interconnect lines. The measured results can be analyzed under conditions more approximate to diverse situations exhibited in practical chips in accordance with development of manufacturing processes and techniques. It is also possible to provide the basis of a model which more effectively represents coupling geometry of more complex semiconductor devices and interconnect lines. The basis of the model may be applied to development of various tools, etc.

19 Claims, 4 Drawing Sheets

APPARATUS AND METHOD FOR MEASURING CHARACTERISTICS OF SEMICONDUCTOR DEVICE

The present application claims priority under 35 U.S.C. 119 to Korean Patent Application No. 10-2008-0137541 (filed on Dec. 30, 2008), which is hereby incorporated by reference in its entirety.

BACKGROUND

A semiconductor device may be produced as follows. First, a semiconductor device to be produced is modeled (hereinafter, referred to as "testing"). Using the results of the testing, a semiconductor device is designed. Using the results of the design, a semiconductor device is produced. If there is an error in the testing, an unintended result may occur in the design of the semiconductor device. Therefore, the testing of a semiconductor device to be produced is very important.

Hereinafter, a related testing method for a semiconductor device will be described with reference to the accompanying drawings. FIG. 1 is a block diagram schematically illustrating a related test circuit having a ring structure, which is an object to be tested. Referring to FIG. 1, a plurality of semiconductor devices 10, 12, . . . , 14, and 16 are interconnected by interconnect lines 20, 22, . . . , 24, and 26. The test circuit shown in FIG. 1, has a ring structure in which a plurality of stages (10 and 20), (12 and 22), . . . , and (16 and 26) are connected in series. Where the devices 10, 12, . . . , 14, and 16 included in respective stages shown in FIG. 1 are complementary metal oxide semiconductor (CMOS) transistors, the test circuit forms a ring oscillator.

Hereinafter, an example of each stage in the ring oscillator will be described with reference to the accompanying drawings. FIG. 2 is a circuit diagram illustrating one of the unit stages (10 and 20), (12 and 22), . . . , and (16 and 26) shown in FIG. 1, for example, the unit stage (10 and 20).

The semiconductor device 10 shown in FIG. 2 is a CMOS inverter, and includes a PMOS transistor MP1 and an NMOS transistor MN1. The semiconductor device 10 is connected to an input side of the next stage 12 by the interconnect line 20. Where the semiconductor device 10 is implemented as shown in FIG. 2, the RC time constant delay of the interconnect lines 20, 22, . . . , 24, and 26 is tested as follows.

First, a first time constant delay of the circuit shown in FIG. 1 is calculated under the condition that the inputs and outputs of the semiconductor devices 10, 12, . . . , 14, and 16 are directly interconnected without using the interconnect lines 20 to 26. Thereafter, a second time constant delay of the circuit shown in FIG. 1 is calculated under the condition that the semiconductor devices 10, 12, . . . , 14, and 16 are interconnected by the interconnect lines 20, 22, . . . , 24, and 26. The result obtained by subtracting the first time constant delay from the second time constant delay is the time constant delay of the interconnect lines 20, 22, . . . , 24, and 26. Thus, it is possible to define a delay according to the resistance and capacitance values per unit length of the interconnect lines 20, 22, . . . , 24, and 26 by analyzing the calculated time constant delay of the interconnect lines 20, 22, . . . , 24, and 26.

In a practical semiconductor device, however, the voltage supplied to the semiconductor device may not always be constant, or may not be maintained at a constant value. That is, the semiconductor device may have various layouts. For this reason, where the time constant delays are measured and analyzed, there may be a problem in that it may be impossible to accurately model semiconductor devices of various types.

SUMMARY

Embodiments relate to a semiconductor device, and more particularly, to an apparatus and method for measuring the characteristics of a semiconductor device.

Even more particularly, embodiments relate to an apparatus and method for measuring the characteristics of a semiconductor device, which is capable of accurately measuring time constant (RC) delay of interconnect lines while accurately reflecting the characteristics of a semiconductor device to be practically produced, and analyzing the measured time constant delay.

Embodiments relate to an apparatus for measuring characteristics of a semiconductor device which may include first to M-th (wherein M is a positive integer not less than 1) starved devices each being biased in response to a bias voltage varying in accordance with a variable first supply voltage, thereby varying an amount of current flowing through a semiconductor device included in the starved device. Interconnect lines may interconnect the first to M-th starved devices. A measuring unit measures at least one of a delay time caused by the semiconductor devices of the starved devices themselves, and a compound delay time caused by the semiconductor devices of the starved devices themselves plus a delay time caused by the interconnect lines.

Embodiments also relate to a method for measuring characteristics of semiconductor devices, in a characteristic measuring apparatus including a current amount varying unit being biased in response to a bias voltage flowing through each of the semiconductor devices, a bias voltage supply unit for outputting the bias voltage, which is varied in accordance with a variable supply voltage, to the current amount varying unit, and a measuring unit for measuring the characteristics of the semiconductor devices, which are connected by interconnect lines, includes measuring a first delay time caused by a delay generated in the semiconductor devices under a condition that the semiconductor devices are interconnected by the interconnect lines, measuring a second delay time caused by a delay generated in the semiconductor devices under a condition in which the semiconductor devices are directly interconnected without using the interconnect lines, and subtracting the second delay time from the first delay time, and determining a result of the subtraction as a delay time caused by a delay generated only in the interconnect lines, wherein the first and second delay times are measured in accordance with a variation in the bias voltage.

DRAWINGS

Figure 3:
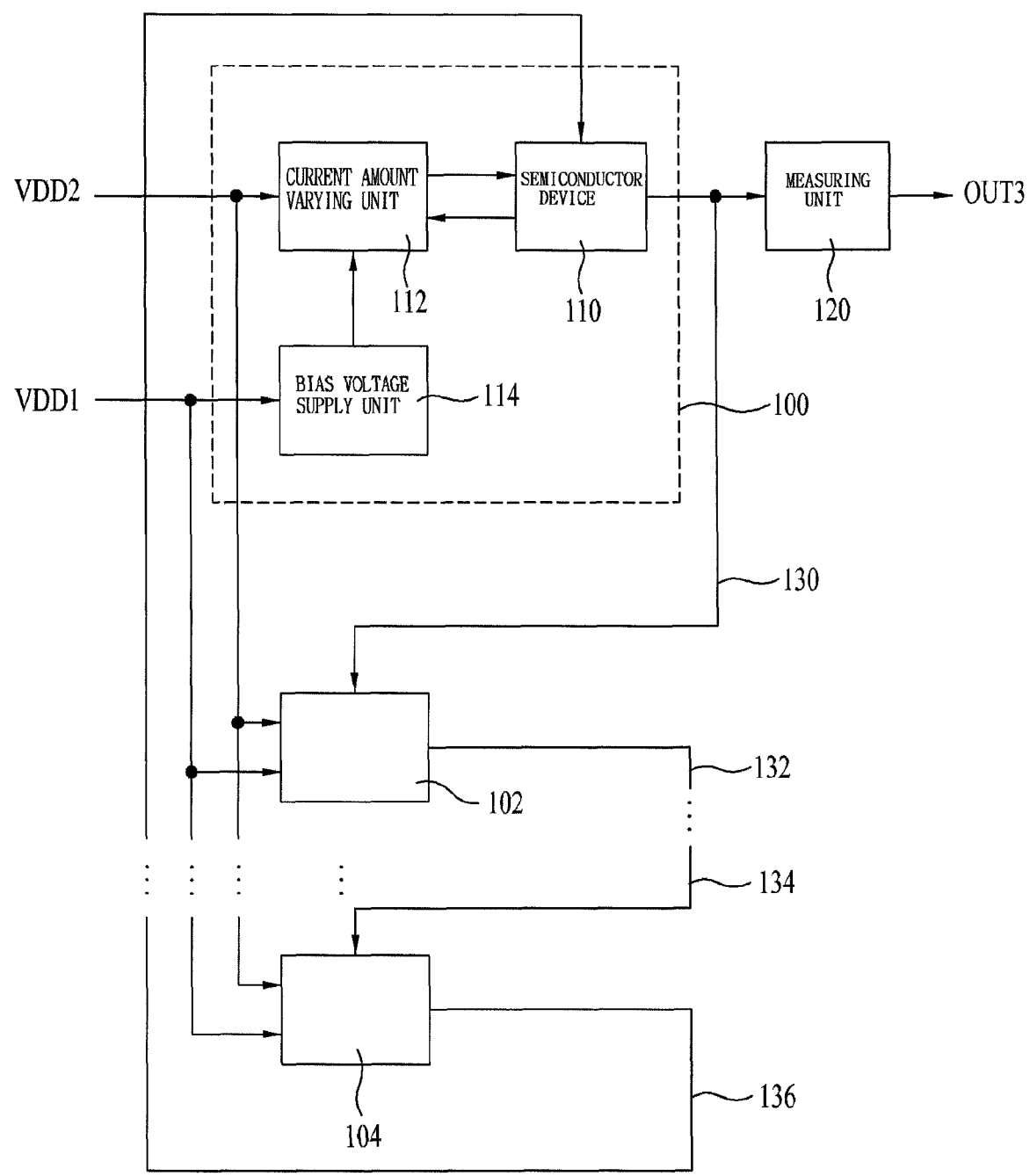

Example FIG. 3 is a block diagram illustrating an apparatus for measuring the characteristics of a semiconductor device in accordance with embodiments.

Figure 4:
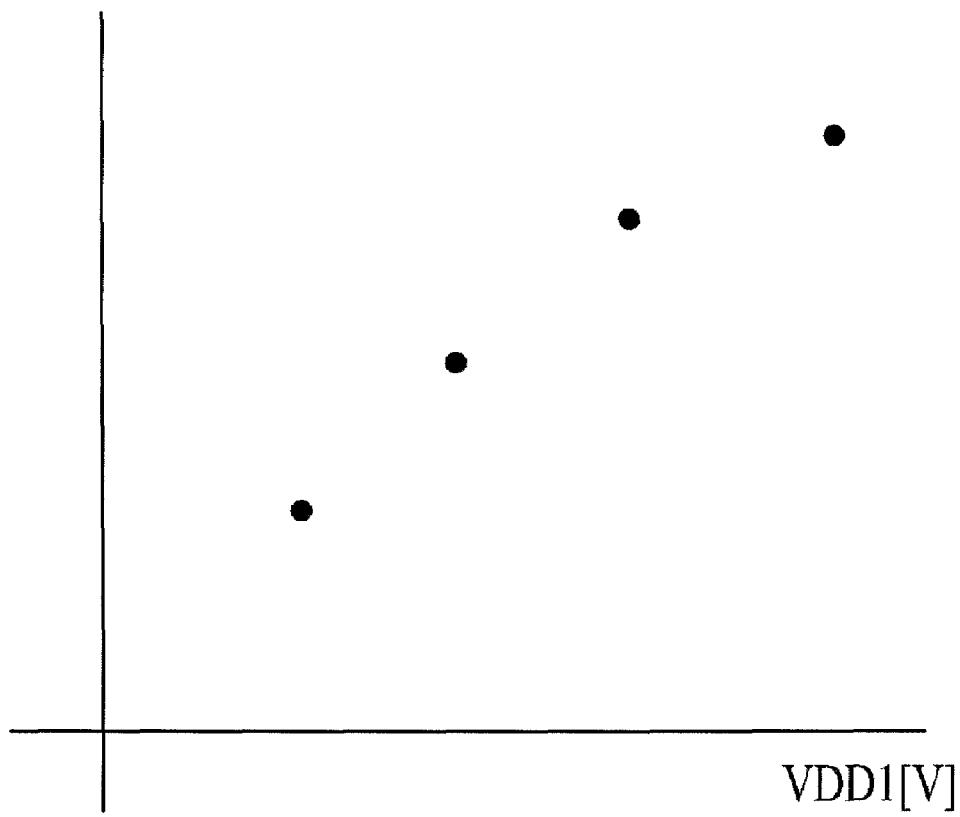

Example FIG. 4 is a graph depicting a variation in the operation frequency of a ring oscillator according to a variation in first supply voltage.

Figure 5:
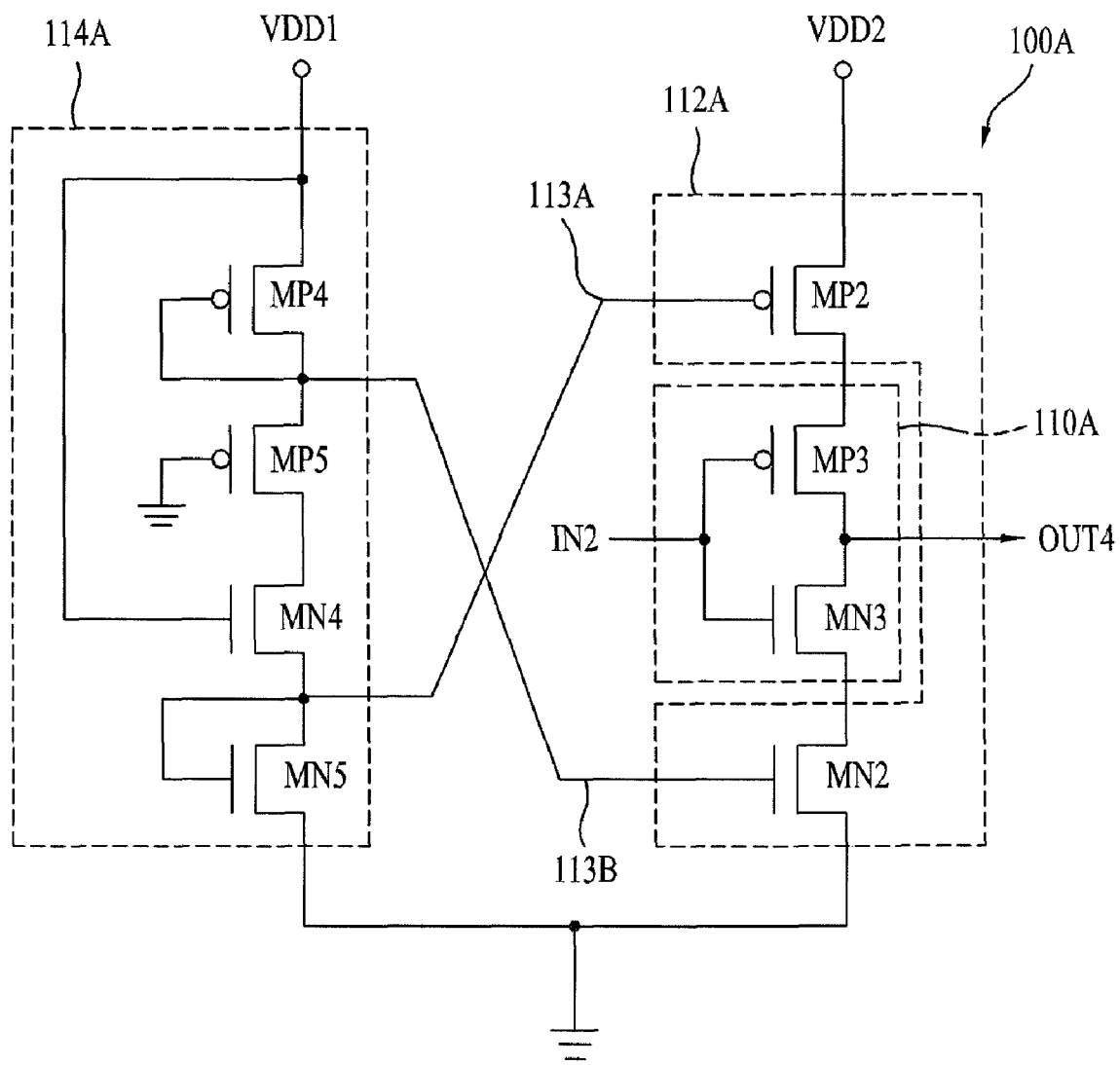

Example FIG. 5 is a circuit diagram an exemplary embodiment of a first starved device shown in example FIG. 3 in accordance with embodiments.

DESCRIPTION

Example FIG. 3 is a block diagram illustrating an apparatus for measuring the characteristics of a semiconductor device in accordance with embodiments. The measuring apparatus includes one or more starved devices 100, 102, ..., and 104, and a measuring unit 120. Here, the term "starved device" means a device capable of varying a voltage or current to be supplied to a device included therein.

Figure 1:
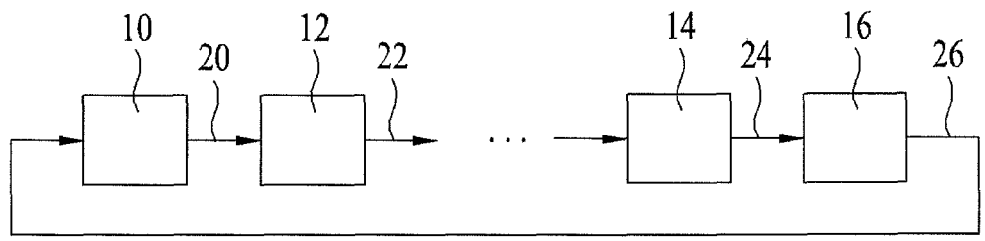
FIG. 1 is a block diagram schematically illustrating a related test circuit having a ring structure, which is an object to be tested.
Figure 2:
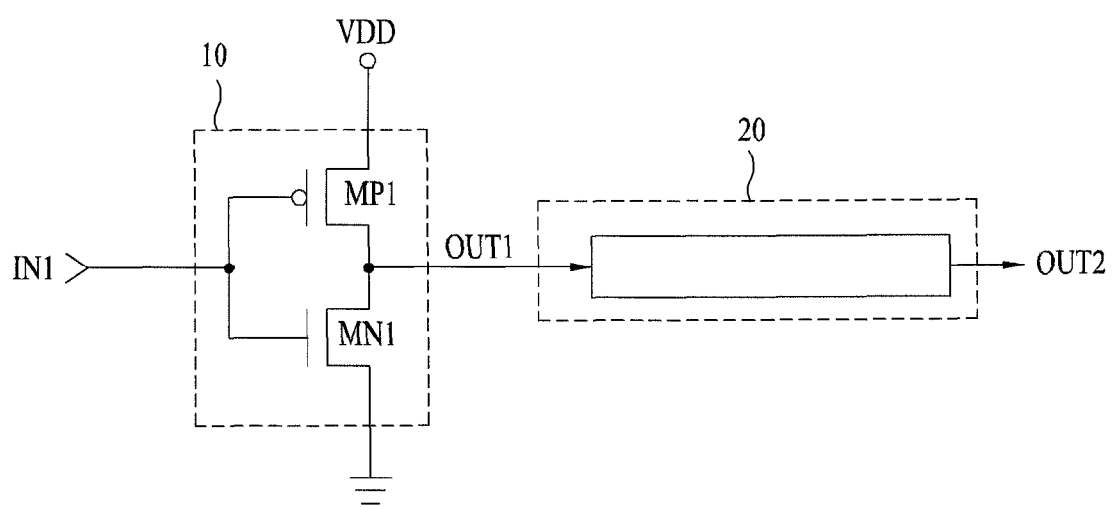
FIG. 2 is a circuit diagram illustrating one of unit stages shown in FIG. 2.

A semiconductor device 110, which may be included in each starved device, may have various circuits in the form of semiconductor devices. For example, the semiconductor device 110 may be an inverter 10, which may be manufactured using semiconductor devices, as shown in FIG. 2. The first, second, ..., and M-th starved devices 100, 102, ..., and 104 shown in example FIG. 3 have the same circuit configuration. Here, "M" is a positive integer not less than 1. That is, the second to M-th starved devices 102, ..., and 104 have the same circuit configuration as the first starved device 100.

As shown in example FIG. 3, the first to M-th starved devices 100, 102, ..., and 104 in the semiconductor device characteristic measuring apparatus according to the illustrated embodiments may be configured to have a chain structure. An example of the chain shape is a ring structure as shown in example FIG. 3. Here, the "ring structure' means a structure in which: an output from the semiconductor device 110 included in the first starved device 100 may be supplied to an input terminal of a semiconductor device included in the second starved device 102 via an interconnect line or delay line 130; an output from the semiconductor device included in the second starved device 102 may be supplied to an input terminal of a semiconductor device included in a third starved device via an interconnect line or delay line 132; and an output from a semiconductor device included in the "M–1"-th starved device may be supplied to an input terminal of a semiconductor device included in the M-th starved device 104 via an interconnect line or delay line 134. As apparent from the above description, the first to M-th starved devices 100, 102, ..., and 104 may be interconnected by the interconnection lines 130, 132, ..., and 134.

Each of the starved devices 100, 102, ..., and 104 shown in example FIG. 3 may be biased in response to a bias voltage varying in accordance with a variation in a first supply voltage VDD1, thereby varying an amount of current flowing through the semiconductor device 110 included in the starved device. To this end, the first supply voltage VDD1 may be varied through an external power supply. Each of the starved devices 100, 102, ..., and 104 may include a current amount varying unit 112 and a bias voltage supply unit 114, in addition to the semiconductor device 110.

Where the semiconductor device 110 included in each of the starved devices 100, 102, ..., and 104 is an inverter, and the starved devices 100, 102, ..., and 104 are interconnected in the form of a chain by the interconnect lines 130, 132, ..., 134, and 136, the first to M-th starved devices 100, 102, ..., and 104 constitute a ring oscillator. In the case of the ring oscillator, M may be 51 (M=51).

The current amount varying unit 112 may be biased in response to a bias voltage output from the bias voltage supply unit 114, thereby varying the amount of current flowing through the semiconductor device 110. In this case, the current amount varying unit 112 receives a second supply voltage VDD2 from an outside of the associated starved device.

The bias voltage supply unit 114 generates the bias voltage, which may be varied in accordance with the first supply voltage VDD1 supplied from an outside of the associated starved device, and outputs the generated bias voltage to the current amount varying unit 112. In accordance with embodiments, the first supply voltage VDD1 and second supply voltage VDD2 may be different from each other. This is because the second supply voltage VDD2 has a fixed value, whereas the first supply voltage VDD1 has a variable value.

The measuring unit 120 measures at least one of first and second delay times. Here, the "first delay time" means a time constant (RC) delay time of the first to M-th starved devices 100, 102, ..., and 104 under the condition that the semiconductor devices 100 of the first to M-th starved devices 100, 102, ..., and 104 are directly interconnected without using the interconnect lines 130, 132, ..., 134, and 136. The "interconnection of the semiconductor devices 110" means that: an output terminal of the semiconductor device 110 of the first starved device 100 is directly connected to an input terminal of the semiconductor device included in the second starved device 102 without using the interconnect line 130; an output terminal of the semiconductor device of the second starved device 102 is directly connected to an input terminal of the semiconductor device included in the third starved device without using the interconnect line 132; an output terminal of the semiconductor device of the "M−1"-th starved device is directly connected to an input terminal of the semiconductor device included in the M-th starved device 104 without using the interconnect line 134; and an output terminal of the semiconductor device of the M-th starved device is directly connected to an input terminal of the semiconductor device 110 included in the first starved device 100 without using the interconnect line 136.

Also, the "second delay time" means a time constant (RC) delay time of the first to M-th starved devices 100, 102, ..., and 104 under the condition that the semiconductor devices 100 of the first to M-th starved devices 100, 102, ..., and 104 are interconnected via the interconnect lines 130, 132, ..., 134, and 136. The "interconnection of the semiconductor devices 110 via the interconnect lines 130, 132, ..., 134, and 136" means that: the output terminal of the semiconductor device 110 of the first starved device 100 is connected to the input terminal of the semiconductor device included in the second starved device 102 via the interconnect line 130; the output terminal of the semiconductor device of the second starved device 102 is connected to the input terminal of the semiconductor device included in the third starved device via the interconnect line 132; the output terminal of the semiconductor device of the "M−1"-th starved device is directly connected to the input terminal of the semiconductor device included in the M-th starved device 104 via the interconnect line 134; and the output terminal of the semiconductor device of the M-th starved device is connected to the input terminal of the semiconductor device 110 included in the first starved device 100 via the interconnect line 136.

Example FIG. 4 is a graph depicting a variation in the operation frequency of the ring oscillator according to a variation in the first supply voltage VDD1. In the graph, the horizontal axis represents the first supply voltage VDD1, and the vertical axis represents the frequency.

The measuring unit 120 determines the result obtained by subtracting the measured first delay time from the measured second delay time, as the time constant (RC) delay time of only the interconnect lines 130, 132, ..., 134, and 136.

For example, where the first to M-th starved devices 100, 102, ..., and 104 shown in example FIG. 3 constitute a ring oscillator, the measuring unit 120 may measure at least one of the first and second delay times of the ring oscillator, which includes the first to M-th starved devices 100, 102, ..., and 104, and may analyze the frequency characteristics of the ring oscillator based on the measured delay times, as shown in example FIG. 4. In order to more precisely analyze the frequency characteristics of the ring oscillator, the measurement of the delay times may be carried out under a condition that the first supply voltage VDD 1 is varied at least three times such that the delay times are measured for variations of the bias voltage exhibited in accordance with respective variations of the first supply voltage VDD1. Example FIG. 4 depicts frequency characteristics measured while varying the first supply voltage VDD1 four times. The fact that there is no measured delay time means that the period of the ring oscillator is long. On the other hand, the fact that there is a measured delay time means that the period of the ring oscillator is short.

The measuring unit 120 may also define a delay according to the resistance and capacitance per unit length of the interconnect lines 130, 132, . . . , 134, and 136, using the time constant (RC) delay of only the interconnect lines 130, 132, . . . , 134, and 136. As described above, at least one of the measured and defined results may be used in modeling the semiconductor device 110. For example, in a modeling task, it may be possible to extract design parameter values, using at least one of the measured and defined results.

Hereinafter, the detailed circuit configuration and operation of each starved device shown in example FIG. 3 will be described with reference to the accompanying drawings. Example FIG. 5 is a circuit diagram illustrating a detailed example 100A of the first starved device 100 shown in example FIG. 3 in accordance with embodiments. The starved device 100A may include a semiconductor device 110A, a current amount varying unit 112A, and a bias voltage supply unit 114A.

The current amount varying unit 112A includes a first PMOS transistor MP2 and a first NMOS transistor MN2. The first PMOS transistor MP2 has a gate connected to a first bias voltage 113A, a source connected to a second supply voltage VDD2, and a drain connected to the semiconductor device 110A. The first NMOS transistor MN2 has a gate connected to a second bias voltage 113B, a drain connected to the semiconductor device 110A, and a source connected to ground as a reference potential.

The first PMOS transistor MP2 of the current amount varying unit 112A functions as a current source to supply, to the semiconductor device 110A, a current varying as the first bias voltage 113A may be varied in accordance with a variation in the first supply voltage VDD1. The first NMOS transistor MN2 functions as a path allowing the current emerging from the semiconductor device 110A to flow to the reference potential.

The semiconductor device 110A includes a second PMOS transistor MP3 and a second NMOS transistor MN3. The second PMOS transistor MP3 has a gate connected to an input terminal IN2 of the semiconductor device 110A, a source connected to the drain of the first PMOS transistor MP2, and a drain connected to an output terminal OUT4 of the semiconductor device 110A. The second NMOS transistor MN3 includes a gate connected to the input terminal IN2, a drain connected to the output terminal OUT4, and a source connected to the drain of the first NMOS transistor MN2. The bias voltage supply unit 114A includes third and fourth PMOS transistors MP4 and MP5, and third and fourth NMOS transistors MN4 and MN5.

The third PMOS transistor MP4 has a source connected to the first supply voltage VDD1, a gate connected to the gate of the first NMOS transistor MN2, and a drain connected to the gate of the first NMOS transistor MN2. The fourth PMOS transistor MP5 has a gate connected to the ground as a reference potential, and a source connected to the second bias voltage 113B. The third NMOS transistor MN4 has a gate connected to the first supply voltage VDD1, a drain connected to the drain of the fourth PMOS transistor MP5, and a source connected to the first bias voltage 113A. The fourth NMOS transistor MN5 has a gate connected to the first bias voltage 113A, a drain connected to the first bias voltage 113A, and a source connected to the reference potential. The third and fourth PMOS transistors MP4 and MP5, and the third and fourth NMOS transistors MN4 and MN5 have a current mirror structure.

Hereinafter, a method for measuring the characteristics of a semiconductor device, which may be carried out with the above-described semiconductor device characteristic measuring apparatus in accordance with embodiments, will be described. The measuring unit 120 measures the delay generated in the semiconductor devices interconnected by the interconnect lines 130, 132, . . . , 134, and 136, namely, the first delay time, and measures the delay generated in the semiconductor devices directly connected without using the interconnect lines 130, 132, . . . , 134, and 136, namely, the second delay time. Here, the first and second delay times are the same as described above.

Thereafter, the measuring unit 120 subtracts the second delay time from the first delay time, and determines a result of the subtraction as a time constant delay time of only the interconnect lines 130, 132, . . . , 134, and 136. In this case, the first and second delay times may be measured in accordance with a variation in bias voltage caused by a variation in the first supply voltage VDD1.

In the apparatus and method for measuring the characteristics of a semiconductor device in accordance with embodiments, it is possible to accurately measure, in various ways, the time constant (RC) delay times of semiconductor devices, which have a complex and miniature structure, and lines interconnecting the semiconductor devices by varying the amount of current flowing through the semiconductor devices, using a variable supply voltage. Accordingly, it is possible to analyze the measured results under conditions more approximate to diverse situations exhibited in practical chips in accordance with development of manufacturing processes and techniques. It is also possible to provide the basis of a model which more effectively represents coupling geometry of more complex semiconductor devices and interconnect lines. The basis of the model may be applied to development of various tools, etc. Through the analysis of a variation in the operation frequency of an oscillator, it is also possible to enhance the precision of a circuit simulation representing a practical design.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    first to M-th (wherein M is a positive integer not less than 1) starved devices each being biased in response to a bias voltage varying in accordance with a variable first supply voltage, thereby varying an amount of current flowing through a semiconductor device included in the starved device;
    interconnect lines for interconnecting the first to M-th starved devices; and
    a measuring unit for measuring at least one of a delay time caused by the semiconductor devices of the starved devices themselves, and a compound delay time caused by the semiconductor devices of the starved devices themselves plus a delay time caused by the interconnect lines, wherein:

the measuring unit measures a first delay time caused by the starved devices under a condition that the starved devices are interconnected by the interconnect lines;

the measuring unit measures a second delay time caused by the starved device under a condition that the starved devices are directly interconnected without using the interconnect lines; and the measuring unit subtracts the second delay time from the first delay time, thereby calculating a delay time caused by only the interconnect lines.

2. The apparatus of claim 1, wherein each of the starved devices includes a current amount varying unit biased in response to the bias voltage, thereby varying the amount of current flowing through the semiconductor device of the starved device.

3. The apparatus of claim 2, wherein each of the starved devices includes a bias voltage supply unit for outputting the bias voltage, which is varied in accordance with the first supply voltage, to the current amount varying unit.

4. The apparatus of claim 1, wherein each of the semiconductor devices is an inverter.

5. The apparatus of claim 1, wherein the starved devices are connected in the form of a chain by the interconnect lines.

6. The apparatus of claim 5, wherein the delay times are generated in a ring oscillator comprising the first to M-th starved devices.

7. The apparatus of claim 6, wherein the measuring unit analyzes frequency characteristics of the ring oscillator based on the delay times.

8. The apparatus of claim 7, wherein at least one of a result of the measurement and a result of the definition is used in modeling the semiconductor devices.

9. The apparatus of claim 1, wherein the measuring unit defines a delay according to a resistance and a capacitance per unit length of the interconnect lines.

10. The apparatus of claim 9, wherein at least one of a result of the measurement and a result of the definition is used in modeling the semiconductor devices.

11. The apparatus of claim 1, wherein at least one of a result of the measurement and a result of the definition is used in modeling the semiconductor devices.

12. The apparatus of claim 1, wherein:

the current amount varying unit in each of the starved devices comprises a first PMOS transistor having a gate connected to the bias voltage, a source connected to a second supply voltage, and a drain connected to the semiconductor device of the starved device, and a first NMOS transistor having a gate connected to the bias voltage, a drain connected to the semiconductor device, and a source connected to a reference potential; and the semiconductor device comprises a second PMOS transistor having a gate connected to an input terminal of the semiconductor device, a source connected to the drain of the first PMOS transistor, and a drain connected to an output terminal of the semiconductor device, and a second NMOS transistor having a gate connected to the input terminal, a drain connected to the output terminal, and a source connected to the drain of the first NMOS transistor.

13. The apparatus of claim 12, wherein the bias voltage supply unit comprises:

a third PMOS transistor having a source connected to the first supply voltage, a gate connected to the gate of the first NMOS transistor, and a drain connected to the gate of the first NMOS transistor;

a fourth PMOS transistor having a gate connected to the reference potential, and a source connected to the bias voltage;

a third NMOS transistor having a gate connected to the first supply voltage, a drain connected to a drain of the fourth PMOS transistor, and a source connected to the bias voltage; and a fourth NMOS transistor having a gate connected to the bias voltage, a drain connected to the bias voltage, and a source connected to the reference potential.

14. The apparatus of claim 1, wherein the measurement of the delay times is carried out under a condition that the first supply voltage is varied at least three times such that the delay times are measured for variations of the bias voltage exhibited in accordance with the variations of the first supply voltage.

15. The apparatus of claim 1, wherein the modeling extracts design parameter values, using at least one of the measurement and definition results.

16. The apparatus of claim 13, wherein the first supply voltage and the second supply voltage are different from each other.

17. A method for measuring characteristics of semiconductor devices in a characteristic measuring apparatus including a current amount varying unit being biased in response to a bias voltage flowing through each of the semiconductor devices, a bias voltage supply unit for outputting the bias voltage, which is varied in accordance with a variable supply voltage, to the current amount varying unit, and a measuring unit for measuring the characteristics of the semiconductor devices, which are connected by interconnect lines, comprising:

measuring a first delay time caused by a delay generated in the semiconductor devices under a condition that the semiconductor devices are interconnected by the interconnect lines;

measuring a second delay time caused by a delay generated in the semiconductor devices under a condition in which the semiconductor devices are directly interconnected without using the interconnect lines; and subtracting the second delay time from the first delay time, and determining a result of the subtraction as a delay time caused by a delay generated only in the interconnect lines, wherein the first and second delay times are measured in accordance with a variation in the bias voltage.

18. The method of claim 17, wherein the measurement of the first and second delay times is carried out under a condition that the supply voltage is varied at least three times.

19. The method of claim 18, wherein the first and second delay times are measured for variations of the bias voltage exhibited in accordance with the variations of the supply voltage.

* * * * *